United States Patent
Kohara et al.

(10) Patent No.: US 9,947,604 B2
(45) Date of Patent: Apr. 17, 2018

(54) EPOXY RESIN COMPOSITION, SEMICONDUCTOR SEALING AGENT, AND SEMICONDUCTOR DEVICE

(71) Applicant: NAMICS CORPORATION, Niigata (JP)

(72) Inventors: Kazuyuki Kohara, Niigata (JP); Tomoya Yamazawa, Niigata (JP); Kodai Okoshi, Niigata (JP); Nobuyuki Abe, Niigata (JP)

(73) Assignee: NAMICS CORPORATION, Niigata (JP)

( * ) Notice: Subject to any disclaimer, the term of this patent is extended or adjusted under 35 U.S.C. 154(b) by 0 days.

(21) Appl. No.: 15/038,939

(22) PCT Filed: Nov. 28, 2014

(86) PCT No.: PCT/JP2014/005966
§ 371 (c)(1),
(2) Date: May 24, 2016

(87) PCT Pub. No.: WO2015/079707
PCT Pub. Date: Jun. 4, 2015

(65) Prior Publication Data
US 2017/0005021 A1    Jan. 5, 2017

(30) Foreign Application Priority Data
Nov. 29, 2013 (JP) .................. 2013-247267

(51) Int. Cl.
*H01L 23/29* (2006.01)
*C09J 163/00* (2006.01)
(Continued)

(52) U.S. Cl.
CPC .......... *H01L 23/295* (2013.01); *C08G 59/245* (2013.01); *C08G 59/50* (2013.01);
(Continued)

(58) Field of Classification Search
CPC ....... H01L 23/295; H01L 24/83; H01L 24/29; H01L 2224/32225; H01L 2224/29387;
(Continued)

(56) References Cited

U.S. PATENT DOCUMENTS

2010/0304536 A1    12/2010   Sumita
2011/0083890 A1    4/2011    Mori
2012/0184646 A1    7/2012    Yajima

FOREIGN PATENT DOCUMENTS

CN    101899195 A    12/2010
JP    5174629 A2     7/1993
(Continued)

OTHER PUBLICATIONS

International Search Report dated Jan. 13, 2015 filed in PCT/JP2014/005966.

*Primary Examiner* — Julio J Maldonado
*Assistant Examiner* — Stanetta Isaac
(74) *Attorney, Agent, or Firm* — Rankin, Hill & Clark LLP

(57) ABSTRACT

An epoxy resin composition includes: (A) epoxy resin; (B) a curing agent; (C) 0.1 to 10 mass % of silica filler with an average particle size of 10 nm or more and 100 nm or less; and (D) 40 to 75 mass % of silica filler with an average particle size of 0.3 μm or more and 5 μm or less. The component (C) and the component (D) are contained by 40.1 to 77 mass % in total.

8 Claims, 1 Drawing Sheet

(51) Int. Cl.
  *B32B 27/38* (2006.01)
  *C08K 3/36* (2006.01)
  *C08L 63/00* (2006.01)
  *C08G 59/24* (2006.01)
  *C08G 59/50* (2006.01)
  *H01L 23/00* (2006.01)

(52) U.S. Cl.
  CPC ............... *C08K 3/36* (2013.01); *C08L 63/00* (2013.01); *H01L 24/29* (2013.01); *H01L 24/83* (2013.01); *C08K 2201/014* (2013.01); *H01L 24/13* (2013.01); *H01L 24/16* (2013.01); *H01L 24/32* (2013.01); *H01L 2224/131* (2013.01); *H01L 2224/16225* (2013.01); *H01L 2224/2929* (2013.01); *H01L 2224/29387* (2013.01); *H01L 2224/32225* (2013.01); *H01L 2224/73204* (2013.01); *H01L 2224/8385* (2013.01); *H01L 2224/83102* (2013.01); *H01L 2224/83862* (2013.01)

(58) Field of Classification Search
  CPC ........... H01L 24/13; H01L 2224/16225; H01L 2224/131; C08G 59/50; C08G 59/245; C08K 3/36; C08K 2201/014; C08L 63/00
  See application file for complete search history.

(56) References Cited

FOREIGN PATENT DOCUMENTS

| | | |
|---|---|---|
| JP | 2005036069 A2 | 2/2005 |
| JP | 2005105243 A2 | 4/2005 |
| JP | 2006219575 A2 | 8/2006 |
| JP | 2011006618 A2 | 1/2011 |
| JP | 2011202140 A2 | 10/2011 |
| JP | 2012149111 A2 | 8/2012 |
| JP | 2012211269 A2 | 11/2012 |

EPOXY RESIN COMPOSITION, SEMICONDUCTOR SEALING AGENT, AND SEMICONDUCTOR DEVICE

CROSS REFERENCE TO RELATED APPLICATION

This application claims priority from Japanese Patent Application No. 2013-247267 filed with the Japan Patent Office on Nov. 29, 2013, the entire content of which is hereby incorporated by reference.

TECHNICAL FIELD

The present invention relates to an epoxy resin composition, a semiconductor sealing agent, and a semiconductor device.

BACKGROUND ART

One way to mount a semiconductor element (semiconductor chip) on a substrate (or in a package) is flip-chip mounting. The flip-chip mounting is one of techniques to electrically connect a semiconductor element and a substrate with a bump (solder ball). A space between the semiconductor element and the substrate is filled with a resin composition (so-called under-filling agent) in order to reinforce the periphery of the bump.

In the mounting of the semiconductor element, the substrate is subjected to plasma processing before the application of the sealing agent, and this is in order to improve the wettability between the substrate surface and the sealing agent. However, applying the sealing agent on the substrate after the plasma processing may result in a problem of "bleeding" phenomenon: the liquid component of the sealing agent leaks out toward the semiconductor element. The bleeding possibly deteriorates not just the external appearance but also the conductivity of the electrode.

Various resin compositions have been developed for solving the above problem. Patent Literature 1 has disclosed the liquid sealing resin composition containing a liquid silicone compound with a carboxylic group or an amino group. Patent Literature 2 has disclosed the insulating paste containing silicone rubber micropowder. Patent Literatures 3 and 4 have disclosed the side-filling material containing modified silicone resin and inorganic filler with the surface processed with the methacrylic acid alkyl copolymer and the non-reactive organic silicon compound.

CITATION LIST

Patent Literature

PATENT LITERATURE 1: JP-A-2006-219575
PATENT LITERATURE 2: JP-A-05-174629
PATENT LITERATURE 3: JP-A-2005-36069
PATENT LITERATURE 4: JP-A-2005-105243

SUMMARY

Problems to be Solved

In view of the above, the present invention is to provide an epoxy resin composition with a simpler composition that can suppress the bleeding.

Solution to the Problems

The present invention provides an epoxy resin composition including: (A) epoxy resin; (B) a curing agent; (C) 0.1 to 10 mass % of silica filler with an average particle size of 10 nm or more and 100 nm or less; and (D) 40 to 75 mass % of silica filler with an average particle size of 0.3 µm or more and 5 µm or less. The component (C) and the component (D) are contained by 40.1 to 77 mass % in total.

At least one of the component (C) and the component (D) may be subjected to surface processing with a silane coupling agent.

The component (D) may be subjected to surface processing with amino silane with a structure represented by Formula (1):

[Chemical Formula 1]

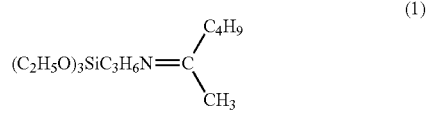

An equivalent ratio between the component (A) and the component (B) may be 0.5 to 1.8.

The component (B) may be an amine curing agent.

The component (A) may include at least one of bisphenol F epoxy resin, bisphenol A epoxy resin, naphthalene epoxy resin, and aminophenol epoxy resin.

A bleeding generated in a bleeding test for a cured product of the epoxy resin composition may be 300 µm or more and less than 1900 µm.

This epoxy resin composition may manufactured in a manner that a master batch is formed by mixing the component (C) in at least a part of the component (A) and another component is mixed in the master batch.

The present invention also provides a semiconductor sealing agent including the epoxy resin composition.

Moreover, the present invention provides a semiconductor device including the semiconductor sealing agent.

Effects of the Invention

According to the present invention, the bleeding can be suppressed by the use of the epoxy resin composition with the simpler composition.

DESCRIPTION OF EMBODIMENTS

1. Bleeding

Figure 1A:
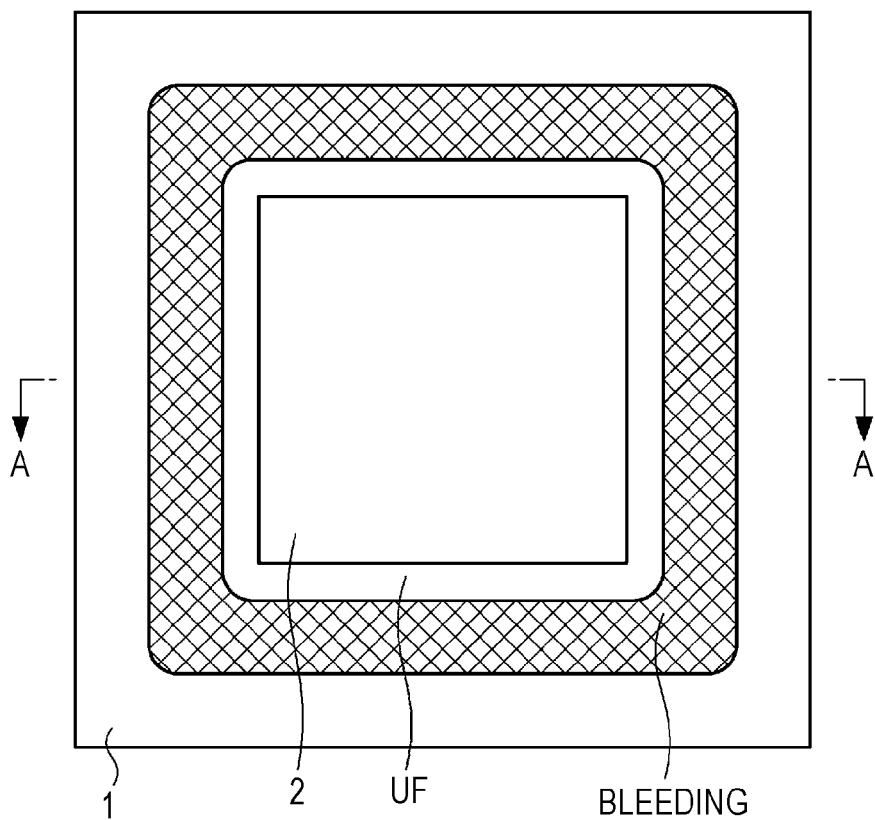
FIG. 1A is a diagram for describing the bleeding.
Figure 1B:
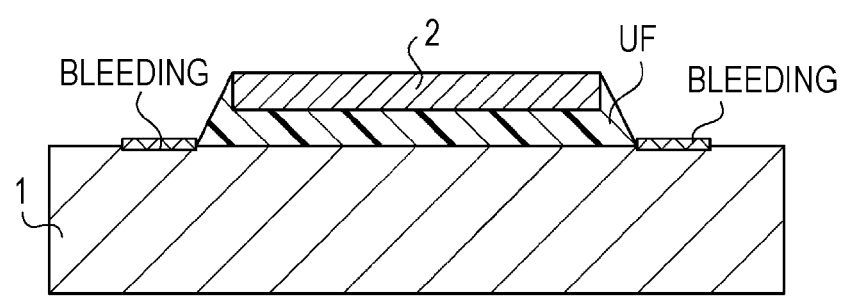
FIG. 1B is a diagram for describing the bleeding.

FIGS. 1A and 1B are diagrams for describing the bleeding occurred in the mounting of the semiconductor element. Here, an example is shown in which a semiconductor element 2 is bonded to a substrate 1 through an under-filling agent. FIG. 1A is a diagram in which a chip is viewed from above, and FIG. 1B is a sectional view taken along A-A of FIG. 1A. Around the semiconductor element 2 is a portion where the under-filling agent UF (sealing agent) is formed (this portion is hereinafter referred to as "fillet"). On the outside of the filler, the bleeding is observed. The bleeding is observed with the unintended color and moreover possibly affects the characteristics and the reliability of the device.

For examining how the bleeding occurs, the inventors of the present application observed the bleeding portion and the non-bleeding portion on the sample manufactured by mounting the semiconductor element on the substrate with the SEM (Scanning Electron Microscope). In the manufacture of this sample, the composition including epoxy resin, a curing agent, silica filler, and other additives is used as the sealing agent. As a result, the present inventors have found out that the bleeding portion do not contain the silica filler. In addition, the present inventors have analyzed the bleeding portion and the non-bleeding portion with the XPS (X-ray Photoelectron Spectroscopy). As a result, between the bleeding portion and the non-bleeding portion, the component difference was not observed except the silica filler.

The above results indicate that the bleeding is formed when the components of the sealing agent other than the silica filler (for example, epoxy resin and curing agent) leak out of the fillet. Moreover, the sample subjected to the plasma processing before the sealing agent is applied was compared with the sample not subjected to the plasma processing. The results indicate that the bleeding was generated in the sample subjected to the plasma processing but not generated in the sample not subjected to the plasma processing.

In view of the above, the inventors of the present application have considered that the bleeding is generated as follows: the plasma processing produces the microscopic unevenness on the substrate surface and the liquid resin component other than the filler leaks out through the capillary phenomenon into that unevenness. In order to suppress the leakage of the liquid resin component through the capillary phenomenon, the present inventors have conceived to use filler with a microscopic diameter to stop the leakage of the liquid resin component.

2. Resin Composition

The epoxy resin composition according to the present invention includes (A) epoxy resin, (B) a curing agent, (C) small-diameter silica filler, and (D) large-diameter silica filler.

Examples of the component (A) include bisphenol A epoxy resin, bisphenol F epoxy resin, naphthalene epoxy resin, aminophenol epoxy resin, phenol novolac epoxy resin, alicyclic epoxy resin, siloxane epoxy resin, biphenyl epoxy resin, glycidylester epoxy resin, glycidylamine epoxy resin, and hydantoin epoxy resin. Among these, bisphenol F epoxy resin, bisphenol A epoxy resin, naphthalene epoxy resin, and aminophenol epoxy resin are preferable. Any of these compounds may be used alone or two or more thereof may be used in mixture as the epoxy resin composition.

Examples of the component (B) include an amine curing agent, an acid anhydride curing agent, and a phenolic curing agent. The amine curing agent is preferably used from the aspect of the reflow resistance and moisture resistance of the liquid resin composition used for the sealing. The preferable equivalent ratio between the component (A) and the component (B) is 0.5 to 1.8.

Examples of the component (C) and the component (D) include amorphous silica, crystalline silica, fused silica, pulverized silica, and nanosilica. The amorphous silica is preferably used from the aspect of the thermal expansion coefficient of the cured resin composition. The shape of the component (C) and the component (D) may be, for example, spherical, scaly, or undermined. The shape is preferably spherical from the aspect of the fluidity of the resin composition. The average particle size of the component (C) and the component (D) is measured by, for example, a dynamic light scattering nanotrac particle size analyzer. The average particle size herein described refers to D50 (median size).

At least one of the component (C) and the component (D) may be subjected to surface processing with a silane coupling agent. Examples of the silane coupling agent used in the surface processing include epoxy, methacrylic, amino, vinyl, glycidoxy, and mercapto silane coupling agents. Among these, amino silane represented by the following Formula (1) is preferably used in the surface processing for the component (D):

[Chemical Formula 2]

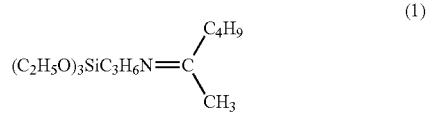

The epoxy resin composition may include, in addition to the components (A), (B), (C), and (D), an additive such as an ion trapping agent, a pigment, a dye, a defoaming agent, a stress relieving agent, a pH adjuster, a promoter, a surfactant, or a coupling agent.

The epoxy resin composition is manufactured by, for example, stirring, melting, and mixing or dispersing the components (A) to (D) and other additives at the same time or separately, while heat is applied thereto if necessary. The methods for mixing, stirring, and dispersing are not particularly limited. A raikai mixer including a stirrer and a heater, a triple roll mill, a ball mill, a planetary mixer, a bead mill, or the like can be used. These devices may be used in combination. Here, the epoxy resin composition can be manufactured in a manner that a master batch is formed by mixing the component (A) and the component (C) and another component is mixed in the master batch.

In a bleeding test to be described below, the bleeding generated from the epoxy resin composition preferably exhibits a value of 300 or more and less than 1900.

The epoxy resin composition can be used as the sealing agent (under-filling agent) when the electronic device such as semiconductor element is mounted by the flip-chip mounting or BGA (Ball Grid Array)/CSP (Chip Size Package) mounting. This epoxy resin composition may be used as an adhesive when attaching the electronic device to the substrate or the package.

In the flip-chip mounting or the BGA/CSP mounting, first, the semiconductor element and the substrate (or the package) are bonded. Next, the sealing agent is injected into the space between the semiconductor element and the substrate. Specifically, the sealing agent is applied along the outer periphery of the semiconductor element. The sealing agent spreads throughout the space by the capillary phenomenon. Therefore, the sealing agent is preferably liquid at the temperature of this process. The injected sealing agent is thermally cured by the heat application (for example, at 80 to 165° C.).

EXAMPLES

3. Examples 3-1. Adjustment of Epoxy Resin Composition

Tables 1 to 4 show the components of the epoxy resin compositions used as the sealing agent in Examples 1 to 25 and Comparative Examples 1 to 6. These tables also show the evaluation results on the epoxy resin compositions used as the sealing agent to be described below. In Tables 1 to 4, the components of the epoxy resin compositions are expressed in mass % except the equivalent ratio.

As the component (A) in the tables, any of epoxy resins a1 to a5 was used. As the epoxy resin a1, YDF8170 manufactured by NIPPON STEEL & SUMIKIN CHEMICAL CO., LTD. was used. As the epoxy resin a2, 850CRP manufactured by DIC Corporation was used. As the epoxy resin a3, HP-4032D manufactured by DIC Corporation was used. As the epoxy resin a4, jer630 manufactured by Mitsubishi Chemical Corporation was used. As the epoxy resin a5, ZX1658GS manufactured by Tohto Kasei Co., Ltd. was used.

As the component (B) in the tables, any of curing agents b1 to b5 was used. The curing agents b1 to b3 are a amine curing agent. The curing agent b4 is an acid anhydride curing agent. The curing agent b5 is a phenolic curing agent. As the curing agent b1, Kayahard AA manufactured by Nippon Kayaku Co., Ltd was used. As the curing agent b2, EH105L manufactured by ADEKA CORPORATION was used. As the curing agent b3, ETHACURE100 manufactured by Albermarle was used. As the curing agent b4, YH307 manufactured by Mitsubishi Chemical Corporation was used. As the curing agent b5, MEH-8005 manufactured by MEIWA PLASTIC INDUSTRIES, LTD. was used.

As the component (C) in the tables, any of YA010C (average particle size: 10 nm), YA050C (average particle size: 50 nm), and YC100C (average particle size: 100 nm) manufactured by Admatechs Company Limited was used. The average particle size is the median size (D50). The average particle size is measured with the field emission scanning electron microscope (FE-SEM).

As the component (D) in the tables, Hyprecica 0.2 μm (average particle size: 0.2 μm) manufactured by UBE EXSYMO CO., LTD, SE-1050 (average particle size: 0.3 μm), SE-2300 (average particle size: 0.6 μm), and SE-4050 (average particle size: 1 μm) manufactured by Admatechs Company Limited, and FB-5D (average particle size: 5 μm) manufactured by Denka Company Limited were used. The average particle size is the median size (D50). The average particle size is measured with the laser diffraction scattering type particle size distribution meter.

As the surface processing agent for the component (D), any of surface processing agents e1 to e3 was used. As the surface processing agent e1, KBM403 (3-glycidoxypropyl trimethoxysilane) manufactured by Shin-Etsu Chemical Co., Ltd. was used. As the surface processing agent e2, KBM503 (3-methacryloxypropyl trimethoxysilane) manufactured by Shin-Etsu Chemical Co., Ltd. was used. As the surface processing agent e3, KBE9103 (3-triethoxysilyl-N-(1,3-dimethyl-butylidene)propylamine) manufactured by Shin-Etsu Chemical Co., Ltd. was used.

In addition to the components (A) to (D), 2P4MZ manufactured by SHIKOKU CHEMICALS CORPORATION was used as the curing promoter.

3-2 Evaluation Method

The epoxy resin compositions used in Examples 1 to 25 and Comparative Examples 1 to 6 were evaluated as below.

3-2-1 Bleeding Test

An organic substrate (FR-4 substrate) with a solder resist (PSR4000 AUS703) attached thereto was used as a sample. First, the sample was dried for an hour at 150° C. Next, this sample was subjected to the plasma processing. The condition of the plasma processing is as follows:
  gas species: Ar
  gas flow rate: 21 sccm
  supply power: 400 W
  process time: 300 seconds For this sample, the epoxy resin composition (sample for evaluation) as the sealing agent was dropped (applied) by 0.5 mg. After the dropping, the sealing agent was thermally cured for two hours at 150° C. After the curing, the length of the generated bleeding was measured.

3-2-2 Viscosity

With the Brookfield rotatable viscometer, the viscosity of the epoxy resin compositions at 25° C. was measured at 50 rpm.

3-2-3 TI (Thixotropic Index) Value

The viscosity of the epoxy resin composition was measured at 5 rpm and 50 rpm. The value obtained by dividing the value of the viscosity at 5 rpm by the value of the viscosity at 50 rpm was used as the TI value.

3-2-4 Injection Property

The epoxy resin composition was injected into the gap (space) of 20 μm at 110° C. The time required for the injected epoxy resin composition to reach the position 20 mm from the entrance was measured. As it takes shorter time to reach, the injection property is better. The cross mark "x" in the column of the injection property indicates that the epoxy resin composition failed to reach the position 20 mm (i.e., defective).

3-2-5 Adhesion

The epoxy resin composition (sample for evaluation) as the sealing agent was potted by approximately 0.5 mg on FR-4. On this sealing agent, a silicon chip with a length of 2 mm on each side was placed. The silicon chip was left in this state for five minutes under room temperature. After that, the sealing agent was cured using a fan dryer at 150° C. for 120 minutes. The adhesion strength of the thusly obtained test piece was measured using a tabletop strength testing machine (1605HTP, manufactured by AIKOH ENGINEERING CO., LTD.). The average value from the ten measurement values was used as the test value.

3-3 Evaluation Results

TABLE 1

| | | | Comparative Example 1 | Comparative Example 2 | Example 1 | Example 2 | Example 3 | Example 4 |
|---|---|---|---|---|---|---|---|---|
| Composition | Component (A) | a1 | 30.7 | 30.7 | 30.7 | 30.7 | 30.7 | 30.7 |
| | | a2 | | | | | | |
| | | a3 | | | | | | |
| | | a4 | | | | | | |
| | | a5 | | | | | | |
| | Component (B) | b1 | 12.3 | 12.3 | 12.3 | 12.3 | 12.3 | 12.3 |
| | | b2 | | | | | | |
| | | b3 | | | | | | |
| | | b4 | | | | | | |
| | | b5 | | | | | | |

TABLE 1-continued

|  |  |  |  |  |  |  |  |
|---|---|---|---|---|---|---|---|
| | Component (C) | 10 nm | 0.0 | 0.05 | 0.1 | 2.0 | 5.0 | 10.0 |
| | | 50 nm | | | | | | |
| | | 100 nm | | | | | | |
| | Component (D) | 0.2 μm | | | | | | |
| | | 0.3 μm | | | | | | |
| | | 0.6 μm | 57.0 | 57.0 | 56.9 | 55.0 | 52.0 | 47.0 |
| | | 1 μm | | | | | | |
| | | 5 μm | | | | | | |
| | Surface processing agent for Component (D) | | e1 | e1 | e1 | e1 | e1 | e1 |
| | Equivalent ratio Promoter | eq | 1.0 | 1.0 | 1.0 | 1.0 | 1.0 | 1.0 |
| | Total | | 100.0 | 100.0 | 100.0 | 100.0 | 100.0 | 100.0 |
| Evaluation | Bleeding | μm | 2000 | 1900 | 1700 | 950 | 630 | 330 |
| | Viscosity | Pa·s | 12 | 12 | 12 | 18 | 33 | 71 |
| | TI | | 0.7 | 0.7 | 0.7 | 0.8 | 1.0 | 1.1 |
| | Injection property | sec | 91 | 111 | 111 | 116 | 165 | 232 |
| | Adhesion strength | N | 353 | 353 | 353 | 363 | 363 | 372 |

| | | | Comparative Example 3 | Example 2 | Example 5 | Example 6 | Comparative Example 4 |
|---|---|---|---|---|---|---|---|
| Composition | Component (A) | a1 | 30.7 | 30.7 | 30.7 | 30.7 | 30.7 |
| | | a2 | | | | | |
| | | a3 | | | | | |
| | | a4 | | | | | |
| | | a5 | | | | | |
| | Component (B) | b1 | 12.3 | 12.3 | 12.3 | 12.3 | 12.3 |
| | | b2 | | | | | |
| | | b3 | | | | | |
| | | b4 | | | | | |
| | | b5 | | | | | |
| | Component (C) | 10 nm | 11.0 | 2.0 | | | |
| | | 50 nm | | | 2.0 | | |
| | | 100 nm | | | | 2.0 | |
| | Component (D) | 0.2 μm | | | | | 2.0 |
| | | 0.3 μm | | | | | |
| | | 0.6 μm | 46.0 | 55.0 | 55.0 | 55.0 | 55.0 |
| | | 1 μm | | | | | |
| | | 5 μm | | | | | |
| | Surface processing agent for Component (D) | | e1 | e1 | e1 | e1 | e1 |
| | Equivalent ratio Promoter | eq | 1.0 | 1.0 | 1.0 | 1.0 | 1.0 |
| | Total | | 100.0 | 100.0 | 100.0 | 100.0 | 100.0 |
| Evaluation | Bleeding | μm | 300 | 950 | 1500 | 1800 | 1900 |
| | Viscosity | Pa·s | 121 | 18 | 13 | 13 | 12 |
| | TI | | 1.2 | 0.8 | 0.7 | 0.8 | 0.7 |
| | Injection property | sec | 250 | 116 | 110 | 160 | 130 |
| | Adhesion strength | N | 372 | 363 | 363 | 363 | 363 |

Comparative Example 1 shows the example of using the epoxy resin composition without the component (C). Without the component (C), the sample has a bleeding length of 2000 μm. Based on this, the sample with a bleeding length of 1900 μm or more is determined defective in the bleeding test. In Examples 1 to 4 and Comparative Examples 1 to 3, the content amount of the component (C) varies. As the component (C) is contained more relative to the entire amount of resin compositions, the bleeding length is shorter. When the component (C) is contained by 0.1 mass % or more, the bleeding length is less than 1900 μm. That is to say, when the component (C) is contained by 0.1 mass % or more, the bleeding is suppressed. However, when the component (C) is contained by 11 mass %, the viscosity is 121 Pa·s. In view of this, the content amount of the component (C) from the viewpoint of the viscosity that is appropriate as the sealing agent is preferably 10 mass % or less. Therefore, the content amount of the component (C) relative to the entire amount of epoxy resin composition is preferably 0.1 to 10 mass %.

In Examples 2, 5, and 6 and Comparative Example 4, the average particle size of the component (C) varies. Note that Comparative Example 4 employs the component (D) with an average particle size of 0.2 μm (i.e., 200 nm) instead of the component (C). When the average particle size of the component (C) is reduced, the bleeding length is shortened. When the average particle size of the component (C) is 200 nm or more, the defect occurs in the bleeding test. On the other hand, when the average particle size is in the range of 10 nm or more and 100 nm or less, the bleeding is suppressed. Since Example 2 is often referred to in the description below, Example 2 is shown again in Tables 1 to 4 for simplifying the description.

TABLE 2

|  |  |  | Comparative Example 5 | Example 7 | Example 2 | Example 8 | Example 9 |
|---|---|---|---|---|---|---|---|
| Composition | Component (A) | a1 | 30.7 | 30.7 | 30.7 | 30.7 | 41.4 |
|  |  | a2 |  |  |  |  |  |
|  |  | a3 |  |  |  |  |  |
|  |  | a4 |  |  |  |  |  |
|  |  | a5 |  |  |  |  |  |
|  | Component (B) | b1 | 12.3 | 12.3 | 12.3 | 12.3 | 16.6 |
|  |  | b2 |  |  |  |  |  |
|  |  | b3 |  |  |  |  |  |
|  |  | b4 |  |  |  |  |  |
|  |  | b5 |  |  |  |  |  |
|  | Component (C) | 10 nm | 2.0 | 2.0 | 2.0 | 2.0 | 2.0 |
|  |  | 50 nm |  |  |  |  |  |
|  |  | 100 nm |  |  |  |  |  |
|  | Component (D) | 0.2 μm | 55.0 |  |  |  |  |
|  |  | 0.3 μm |  | 55.0 |  |  |  |
|  |  | 0.6 μm |  |  | 55.0 |  | 40.0 |
|  |  | 1 μm |  |  |  |  |  |
|  |  | 5 μm |  |  |  | 55.0 |  |
|  | Surface processing agent for Component (D) |  | e1 | e1 | e1 | e1 | e1 |
|  | Equivalent ratio Promoter | eq | 1.0 | 1.0 | 1.0 | 1.0 | 1.0 |
|  | Total |  | 100.0 | 100.0 | 100.0 | 100.0 | 100.0 |
| Evaluation | Bleeding | μm | 800 | 850 | 950 | 960 | 1081 |
|  | Viscosity | Pa·s | 179 | 48 | 18 | 17 | 9 |
|  | TI |  | 0.3 | 0.7 | 0.8 | 1.2 | 1.0 |
|  | Injection property | sec | 411 | 200 | 116 | 130 | 47 |
|  | Adhesion strength | N | 421 | 392 | 363 | 343 | 363 |

|  |  |  | Example 2 | Example 10 | Example 11 | Example 12 | Comparative Example 6 |
|---|---|---|---|---|---|---|---|
| Composition | Component (A) | a1 | 30.7 | 21.9 |  |  |  |
|  |  | a2 |  |  |  |  |  |
|  |  | a3 |  |  |  |  |  |
|  |  | a4 |  |  |  |  |  |
|  |  | a5 |  |  | 42.4 | 16.8 | 16.1 |
|  | Component (B) | b1 | 12.3 | 8.1 | 15.6 | 6.2 | 5.9 |
|  |  | b2 |  |  |  |  |  |
|  |  | b3 |  |  |  |  |  |
|  |  | b4 |  |  |  |  |  |
|  |  | b5 |  |  |  |  |  |
|  | Component (C) | 10 nm | 2.0 | 2.0 | 2.0 | 2.0 | 2.0 |
|  |  | 50 nm |  |  |  |  |  |
|  |  | 100 nm |  |  |  |  |  |
|  | Component (D) | 0.2 μm |  |  |  |  |  |
|  |  | 0.3 μm |  |  |  |  |  |
|  |  | 0.6 μm | 55.0 | 68.0 |  |  |  |
|  |  | 1 μm |  |  | 40.0 | 75.0 | 76.0 |
|  |  | 5 μm |  |  |  |  |  |
|  | Surface processing agent for Component (D) |  | e1 | e1 | e1 | e1 | e1 |
|  | Equivalent ratio Promoter | eq | 1.0 | 1.0 | 1.0 | 1.0 | 1.0 |
|  | Total |  | 100.0 | 100.0 | 100.0 | 100.0 | 100.0 |
| Evaluation | Bleeding | μm | 950 | 850 | 1070 | 650 | 630 |
|  | Viscosity | Pa·s | 18 | 88 | 4 | 30 | 46 |
|  | TI |  | 0.8 | 0.8 | 1.0 | 0.4 | 0.4 |
|  | Injection property | sec | 116 | 450 | 51 | 900 | x |
|  | Adhesion strength | N | 363 | 402 | 323 | 402 | 402 |

In Comparative Example 5 and Examples 2, 7, and 8, the average particle size of the component (D) varies. When the average particle size of the component (D) is increased, the viscosity is improved. When the average particle size of the component (D) is 0.2 μm or less, the viscosity is 179 Pa·s. From the viewpoint of the viscosity appropriate as the sealing agent, the average particle size of the component (D) is preferably 0.3 μm or more.

In Examples 2 and 9 to 12 and Comparative Example 6, the content amount of the component (D) varies. When the component (D) is contained less, the injection property is improved. When the component (D) is contained by 40 to 75 mass %, the injection property is excellent and the bleeding is suppressed. However, when the component (D) is contained by 76 mass % or more, the defect occurs in the injection property test. From the viewpoint of the injection property appropriate as the sealing agent, the component (D) is contained by preferably 75 mass % or less. The component (C) and the component (D) are preferably contained by 40.1 to 77 mass % in total relative to the entire amount of the resin compositions.

TABLE 3

|  |  |  | Example 13 | Example 2 | Example 14 | Example 15 | Example 16 | Example 2 | Example 17 |
|---|---|---|---|---|---|---|---|---|---|
| Composition | Component (A) | a1 | 30.7 | 30.7 | 30.7 | 30.7 | 35.8 | 30.7 | 25.0 |
|  |  | a2 |  |  |  |  |  |  |  |
|  |  | a3 |  |  |  |  |  |  |  |
|  |  | a4 |  |  |  |  |  |  |  |
|  |  | a5 |  |  |  |  |  |  |  |
|  | Component (B) | b1 | 12.3 | 12.3 | 12.3 | 12.3 | 7.2 | 12.3 | 18.0 |
|  |  | b2 |  |  |  |  |  |  |  |
|  |  | b3 |  |  |  |  |  |  |  |
|  |  | b4 |  |  |  |  |  |  |  |
|  |  | b5 |  |  |  |  |  |  |  |
|  | Component (C) | 10 nm | 2.0 | 2.0 | 2.0 | 2.0 | 2.0 | 2.0 | 2.0 |
|  |  | 50 nm |  |  |  |  |  |  |  |
|  |  | 100 nm |  |  |  |  |  |  |  |
|  | Component (D) | 0.2 μm |  |  |  |  |  |  |  |
|  |  | 0.3 μm |  |  |  |  |  |  |  |
|  |  | 0.6 μm | 55.0 | 55.0 | 55.0 | 55.0 | 55.0 | 55.0 | 55.0 |
|  |  | 1 μm |  |  |  |  |  |  |  |
|  |  | 5 μm |  |  |  |  |  |  |  |
|  | Surface processing agent for Component (D) |  | None | e1 | e2 | e3 | e1 | e1 | e1 |
|  | Equivalent ratio | eq | 1.0 | 1.0 | 1.0 | 1.0 | 0.5 | 1.0 | 1.8 |
|  | Promoter |  |  |  |  |  |  |  |  |
|  | Total |  | 100.0 | 100.0 | 100.0 | 100.0 | 100.0 | 100.0 | 100.0 |
| Evaluation | Bleeding | μm | 1200 | 950 | 940 | 1050 | 1490 | 950 | 900 |
|  | Viscosity | Pa·s | 23 | 18 | 31 | 26 | 17 | 18 | 20 |
|  | TI |  | 0.8 | 0.8 | 0.9 | 0.9 | 0.7 | 0.8 | 0.9 |
|  | Injection property | sec | 130 | 116 | 110 | 181 | 106 | 116 | 115 |
|  | Adhesion strength | N | 382 | 363 | 372 | 372 | 225 | 363 | 353 |

In Examples 2 and 13 to 15, the surface processing agent for the component (D) varies. The surface processing further suppresses the bleeding. By the use of the surface processing agent e1, the viscosity and the injection property are improved.

In Examples 2, 16, and 17, the equivalent ratio between the epoxy resin (component (A)) and the curing agent (component (B)) varies. When the equivalent ratio is in the range of 0.5 to 1.8, the bleeding is suppressed.

TABLE 4

|  |  |  | Example 2 | Example 18 | Example 19 | Example 20 | Example 21 |
|---|---|---|---|---|---|---|---|
| Composition | Component (A) | a1 | 30.7 |  |  |  |  |
|  |  | a2 |  | 31.5 |  |  |  |
|  |  | a3 |  |  | 29.8 |  |  |
|  |  | a4 |  |  |  | 25.7 |  |
|  |  | a5 |  |  |  |  | 31.5 |
|  | Component (B) | b1 | 12.3 | 11.5 | 13.2 | 17.3 | 11.5 |
|  |  | b2 |  |  |  |  |  |
|  |  | b3 |  |  |  |  |  |
|  |  | b4 |  |  |  |  |  |
|  |  | b5 |  |  |  |  |  |

TABLE 4-continued

|  |  |  |  |  |  |  |  |
|---|---|---|---|---|---|---|---|
| | Component (C) | 10 nm | 2.0 | 2.0 | 2.0 | 2.0 | 2.0 |
| | | 50 nm | | | | | |
| | | 100 nm | | | | | |
| | Component (D) | 0.2 μm | | | | | |
| | | 0.3 μm | 55.0 | 55.0 | 55.0 | 55.0 | 55.0 |
| | | 0.6 μm | | | | | |
| | | 1 μm | | | | | |
| | | 5 μm | | | | | |
| | Surface processing agent for Component (D) | | e1 | e1 | e1 | e1 | e1 |
| | Equivalent ratio | eq | 1.0 | 1.0 | 1.0 | 1.0 | 1.0 |
| | Promoter | | | | | | |
| | Total | | 100.0 | 100.0 | 100.0 | 100.0 | 100.0 |
| Evaluation | Bleeding | μm | 950 | 800 | 600 | 1800 | 800 |
| | Viscosity | Pa · s | 18 | 36 | 83 | 16 | 4 |
| | TI | | 0.8 | 0.9 | 0.9 | 0.8 | 0.7 |
| | Injection property | sec | 116 | 130 | 145 | 110 | 105 |
| | Adhesion strength | N | 363 | 382 | 421 | 353 | 343 |

|  |  |  | Example 2 | Example 22 | Example 23 | Example 24 | Example 25 |
|---|---|---|---|---|---|---|---|
| Composition | Component (A) | a1 | 30.7 | 31.0 | 33.5 | 17.2 | 23.0 |
| | | a2 | | | | | |
| | | a3 | | | | | |
| | | a4 | | | | | |
| | | a5 | | | | | |
| | Component (B) | b1 | 12.3 | | | | |
| | | b2 | | 12.0 | | | |
| | | b3 | | | 9.5 | | |
| | | b4 | | | | 25.4 | |
| | | b5 | | | | | 19.6 |
| | Component (C) | 10 nm | 2.0 | 2.0 | 2.0 | 2.0 | 2.0 |
| | | 50 nm | | | | | |
| | | 100 nm | | | | | |
| | Component (D) | 0.2 μm | | | | | |
| | | 0.3 μm | 55.0 | 55.0 | 55.0 | 55.0 | 55.0 |
| | | 0.6 μm | | | | | |
| | | 1 μm | | | | | |
| | | 5 μm | | | | | |
| | Surface processing agent for Component (D) | | e1 | e1 | e1 | e1 | e1 |
| | Equivalent ratio | eq | 1.0 | 1.0 | 1.0 | 1.0 | 1.0 |
| | Promoter | | | | | 0.4 | 0.4 |
| | Total | | 100.0 | 100.0 | 100.0 | 100.0 | 100.0 |
| Evaluation | Bleeding | μm | 950 | 1420 | 1600 | 730 | 550 |
| | Viscosity | Pa · s | 18 | 12 | 9 | 14 | 48 |
| | TI | | 0.8 | 0.8 | 0.9 | 1.3 | 1.2 |
| | Injection property | sec | 116 | 104 | 88 | 112 | 189 |
| | Adhesion strength | N | 363 | 284 | 108 | 294 | 314 |

In Examples 2 and 18 to 21, the component (A) varies. Using any of the epoxy resins a1 to a5 can suppress the bleeding.

In Examples 2 and 22 to 25, the component (B) varies. Using any of the curing agents b1 to b5 can suppress the bleeding.

The epoxy resin composition according to the present invention may be any of the following first to eighth epoxy resin compositions.

The first epoxy resin composition is an epoxy resin composition including: (A) epoxy resin; (B) a curing agent; (C) 0.1 to 10 mass % of silica filler with an average particle size of 10 nm or more and 100 nm or less; and (D) 40 to 75 mass % of silica filler with an average particle size of 0.3 μm or more and 5 μm or less, wherein the component (C) and the component (D) are contained by 40.1 to 77 mass % in total.

The second epoxy resin composition is the first epoxy resin composition, wherein at least one of the component (C) and the component (D) is subjected to surface processing with a silane coupling agent.

The third epoxy resin composition is the first or second epoxy resin composition, wherein the component (D) is subjected to surface processing with amino silane with a structure represented by Formula (1):

[Chemical Formula 3]

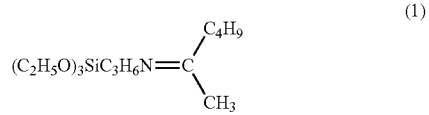

The fourth epoxy resin composition is any of the first to third epoxy resin compositions, wherein an equivalent ratio between the component (A) and the component (B) is 0.5 to 1.8.

The fifth epoxy resin composition is any of the first to fourth epoxy resin compositions, wherein the component (B) is an amine curing agent.

The sixth epoxy resin composition is any of the first to fifth epoxy resin compositions, wherein the component (A) includes at least one of bisphenol F epoxy resin, bisphenol A epoxy resin, naphthalene epoxy resin, and aminophenol epoxy resin.

The seventh epoxy resin composition is any of the first to sixth epoxy resin compositions, wherein a bleeding generated in a bleeding test for a cured product of the epoxy resin composition is 300 μm or more and less than 1900 μm.

The eighth epoxy resin composition is any of the first to seventh epoxy resin compositions, wherein the epoxy resin composition is manufactured in a manner that a master batch is formed by mixing the component (C) in at least a part of the component (A) and another component is mixed in the master batch.

A semiconductor sealing agent according to the present invention may be a semiconductor sealing agent including any of the first to eighth epoxy resin compositions.

Moreover, a semiconductor device according to the present invention may be a semiconductor device including the ninth semiconductor sealing agent.

The invention claimed is:

1. An epoxy resin composition comprising:
   (A) epoxy resin;
   (B) a curing agent;
   (C) 0.1 to 10 mass % of silica filler with an average particle size of 10 nm or more and 100 nm or less; and
   (D) 40 to 75 mass % of silica filler with an average particle size of 0.3 μm or more and 5 μm or less, wherein the component (C) and the component (D) are contained by 40.1 to 77 mass % in total,
a surface of the component (D) is processed with a silane coupling agent, and
the silane coupling agent is amino silane with a structure represented by Formula (1):

2. The epoxy resin composition according to claim 1, wherein an equivalent ratio between the component (A) and the component (B) is 0.5 to 1.8.

3. The epoxy resin composition according to claim 1, wherein the component (B) is an amine curing agent.

4. The epoxy resin composition according to claim 1, wherein the component (A) includes at least one of bisphenol F epoxy resin, bisphenol A epoxy resin, naphthalene epoxy resin, and aminophenol epoxy resin.

5. The epoxy resin composition according to claim 1, wherein a bleeding generated in a bleeding test for a cured product of the epoxy resin composition is 300 μm or more and less than 1900 μm.

6. The epoxy resin composition according to claim 1, wherein the epoxy resin composition is manufactured in a manner that a master batch is formed by mixing the component (C) in at least a part of the component (A) and another component is mixed in the master batch.

7. A semiconductor sealing agent comprising the epoxy resin composition claim 1.

8. A semiconductor device comprising the semiconductor sealing agent according to claim 7.

* * * * *